US006654712B1

(12) United States Patent  (10) Patent No.: US 6,654,712 B1
Blair  (45) Date of Patent: Nov. 25, 2003

(54) METHOD TO REDUCE SKEW IN CLOCK SIGNAL DISTRIBUTION USING BALANCED WIRE WIDTHS

(75) Inventor: Gerard M Blair, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/507,508

(22) Filed: Feb. 18, 2000

(51) Int. Cl.[7] ............................. G06F 17/50; G06G 7/62

(52) U.S. Cl. ............................. 703/14; 703/13; 703/19; 716/4; 716/5; 716/6

(58) Field of Search ............................. 703/14, 13, 19; 716/4–6

(56) References Cited

U.S. PATENT DOCUMENTS

| 5,841,333 A | * 11/1998 | Fishburn et al. | 333/238 |
| 5,845,233 A | 12/1998 | Fishburn | 702/108 |
| 5,859,999 A | 1/1999 | Morris et al. | 395/565 |

(List continued on next page.)

FOREIGN PATENT DOCUMENTS

| JP | 7094590 A | 4/1995 | H01L/21/82 |
| JP | 200116346 A | 6/2000 | G06F/17/50 |
| JP | 2001084282 A | 3/2001 | G06F/17/50 |

OTHER PUBLICATIONS

Puella, et al. "Reliable Non–Zero Skew Clock Trees Using Wire Width Optimization". Proc. 30th Int'l DAC. 1993, pp. 165–170.*
Chen, C.P., et al. "Fast Performance–Driven Optimization for Buffered Clock Trees Based on Lagrangian Relaxation" Proc. 33rd Int'l DAC. 1996. pp. 405–408.*

Menezes, N. et al. "RC Interconnect Synthesis—A Moment Fitting Approach" 1994 IEEE/ACM Int'l Conf. on CAD. 1994. pp. 418–425.*

Lin, S. et al. "Process–Variation–Tolerent Clock Skew Minimization" 1994 IEEE/ACM Int'l Conf. on CAD. 1994. pp. 284–288.*

Culetu, J. et al. "A Practical Repeater Insertion Method in High Speed VLSI Circuits". Proceedings, 1998 Design Automation Conference. Jun. 15–19, 1998, pp. 392–395.*

Mu, Fenghao et al. "Analysis and Optimization of a uniform Long Wire and Driver". IEEE Tansactions on Circuits and Systems I. vol. 46, Issue 9. Sep. 1999. pp 1086–1100.*

(List continued on next page.)

*Primary Examiner*—Russell Frejd
*Assistant Examiner*—Ayal I. Sharon (57) ABSTRACT

What is described is a method to reduce variations in signal delays along paths in a design of an integrated circuit by balancing wire widths. The method operates by performing a circuit simulation to determine simulated signal delays along the circuit paths based on first wire widths for a given circuit, then running a delay model analysis to calculate predicted signal delays along the circuit paths based on first wire widths for the given circuit. The method then calculates a correction difference between the predicted signal delays and the simulated signal delays, and derives delay targets from the correction difference. Finally, the method calculates second wire widths using the delay model analysis to meet the delay targets. Preferably, the signal delays are clock signal delays, the circuit simulation is a SPICE circuit simulation, and the delay model is an Elmore delay model. Also described is a system which includes a CPU and certain memory components for accomplishing the method. Further described is a computer readable medium on which is embedded a program containing the components that execute the described method.

16 Claims, 5 Drawing Sheets

U.S. PATENT DOCUMENTS

| | | | | |
|---|---|---|---|---|
| 5,860,017 | A | | 1/1999 | Sharangpani et al. .. 395/800.23 |
| 6,006,025 | A | * | 12/1999 | Cook et al. .................... 716/14 |
| 6,311,313 | B1 | * | 10/2001 | Camporese et al. ........... 716/6 |
| 6,412,101 | B1 | * | 6/2002 | Chang et al. ................. 716/10 |
| 6,463,574 | B1 | * | 10/2002 | Culetu et al. .................. 716/8 |
| 6,493,854 | B1 | * | 12/2002 | Chowdhurry .................. 716/6 |
| 6,513,149 | B1 | * | 1/2003 | Donato ........................ 716/12 |

OTHER PUBLICATIONS

Fishburn, J.P. "Optimization–Based Calibration of a Static Timing Analyzer to Path Delay Measurements". Proc. IEEE Int'l Symposium on Circuits and Systems (ICAS 1999). vol. 6. Jul. 1999. pp. 186–189.*

Fishburn, J.P. "Shaping a VLSI Wire to Minimize Elmore Delay". European Design and Test Conference (ED&TC 97). 1997. pp. 244–251.*

Wolfe, A., "Patents shed light on Merced's Innards", Electronic Engineering Times, Feb. 15, 1999.

* cited by examiner

METHOD TO REDUCE SKEW IN CLOCK SIGNAL DISTRIBUTION USING BALANCED WIRE WIDTHS

TECHNICAL FIELD

The invention relates to the design of digital electronic circuitry. More particularly, the invention relates to a method for reducing the skew in clock signal distribution by balancing wire widths in an electronic circuit.

BACKGROUND ART

In the design of electronic circuits, particularly microprocessors, it is important to produce a circuit which has a clock signal that arrives simultaneously on all latches within the circuit. This simultaneous clock signal arrival is a key factor in obtaining proper functioning of the circuit. Distributing a clock signal simultaneously throughout a microchip is a difficult challenge because it involves a number of factors, including distance along the paths of the circuit, resistance and capacitance delays, different loads at the ends of the paths, and other complicating factors. It has been necessary to develop special techniques to balance the distribution paths for the clock signal so that it arrives at the end of all of the paths at the same time.

There are techniques for balancing the metal in a circuit if there is total symmetry in the circuit paths, but in practical cases the end points for the clock signal are not symmetrically placed throughout the chip. The general solution used in the art has been to modify the widths of the wires in circuit trees such that the resulting changes in resistance and capacitance along those wires balances the distribution times for the clock signal to all end points. For this type of solution there exists a simplified formula called the Elmore delay model which will determine the delay from a source, to the sink at the end point, i.e., a leaf, in a circuit tree. (see *Optimal Wiresizing Under Elmore Delay Model*, Cong, J. J. and Leung, K-S, *IEEE Trans. on CAD of Integrated Circuits*, Vol. 14, No. 3, March, 1995, 321–335.) The Elmore delay model adds all of the down stream capacitance from a given node, multiplies that by the resistance of the piece of wire that leads to the given node, and then adds that value into a total delay from the given node to each individual leaf. So, the delay from the source to the leaf is calculated by adding together the delay along each segment along the way. The delay along each segment is calculated by multiplying the resistance of that segment with the capacitance down stream from it. The Elmore formula has been the basis for clock signal delay optimization software up to this point. The Elmore model is, however, somewhat inaccurate since it does not model all the effects on a signal in a circuit.

There do exist certain improvements on the Elmore model and some current CAD tools use such improved methods to calculate optimized wire widths. The problems associated with those methods, however, is that there exists another effect that is becoming more important as circuits are reach feature sizes as small as those now being developed in microchip design. That effect is inductance, and there is currently no way to include inductance in the Elmore delay model.

Instead, there are circuit simulations which model all of the resistance, capacitance, and inductance components, such as the SPICE circuit simulation, which is well known in the art. (see Kielkowski, Ron M., 1994, *Inside Spice*, New York, McGraw Hill; and Sandler, Steven M., *SMPS simulation with SPICE*, 1996, McGraw Hill) SPICE is a circuit level simulator and is basically the microchip design industry's standard method for assessing how a circuit is going to operate in reality.

There is a need for improved methods and apparatus for reducing skew in clock signal distribution in an electronic circuit.

SUMMARY OF INVENTION

The improved methods and apparatus incorporate the accuracy of such circuit simulations into a method for improving the balancing of wire widths to reduce the skew in clock signal distribution. Instead of just attempting to predict the delays on a circuit with a model such as Elmore, one can run simulations that send signals through simulated wires and then note what the arrival times for the signal are at the leaves. Adjustments can then be made to the wire widths based upon any disparities that are found. Instead of using Elmore models to set the wires width, the improved methods and apparatus use the wire widths that exist at the current stage of a design to form a stimulation, and uses the Elmore model as a predictor of what changes that should be made to the wire widths to achieve the delays derived in the simulation.

In one respect, what is described is a method to reduce variations in signal delays along paths in a design of an integrated circuit by balancing wire widths. The method comprises performing a circuit simulation to determine simulated signal delays along the circuit paths based on first wire widths for a given circuit, then running a delay model analysis to calculate predicted signal delays along the circuit paths based on first wire widths for the given circuit. The method then calculates a correction difference between the predicted signal delays and the simulated signal delays, and derives delay targets from the correction difference. Finally, the method calculates second wire widths using the delay model analysis to meet the delay targets. Preferably, the signal delays are clock signal delays, the circuit simulation is a SPICE circuit simulation, and the delay model is an Elmore delay model.

In another respect, what is described is a system for reducing variations in clock signal delays. The system comprises a Central Processing Unit (CPU), memory containing an instruction set for wire width balancing operably connected to the CPU, memory containing a circuit simulation instruction set operably connected to the CPU, memory containing a delay model instruction set operably connected to the CPU, and means for outputting or displaying wire width information. The system operates such that the CPU uses the wire width balance, the circuit simulation, and the delay model instruction sets to determine wire width information.

In yet another respect, what is described is a computer readable medium on which is embedded a program. The embedded program comprises components that execute the above method.

Those skilled in the art will appreciate these and other advantages and benefits of the various embodiments of the invention upon reading the following detailed description of a preferred embodiment with reference to the below-listed drawings.

DETAILED DESCRIPTION OF A PREFERRED EMBODIMENT

Figure 1:
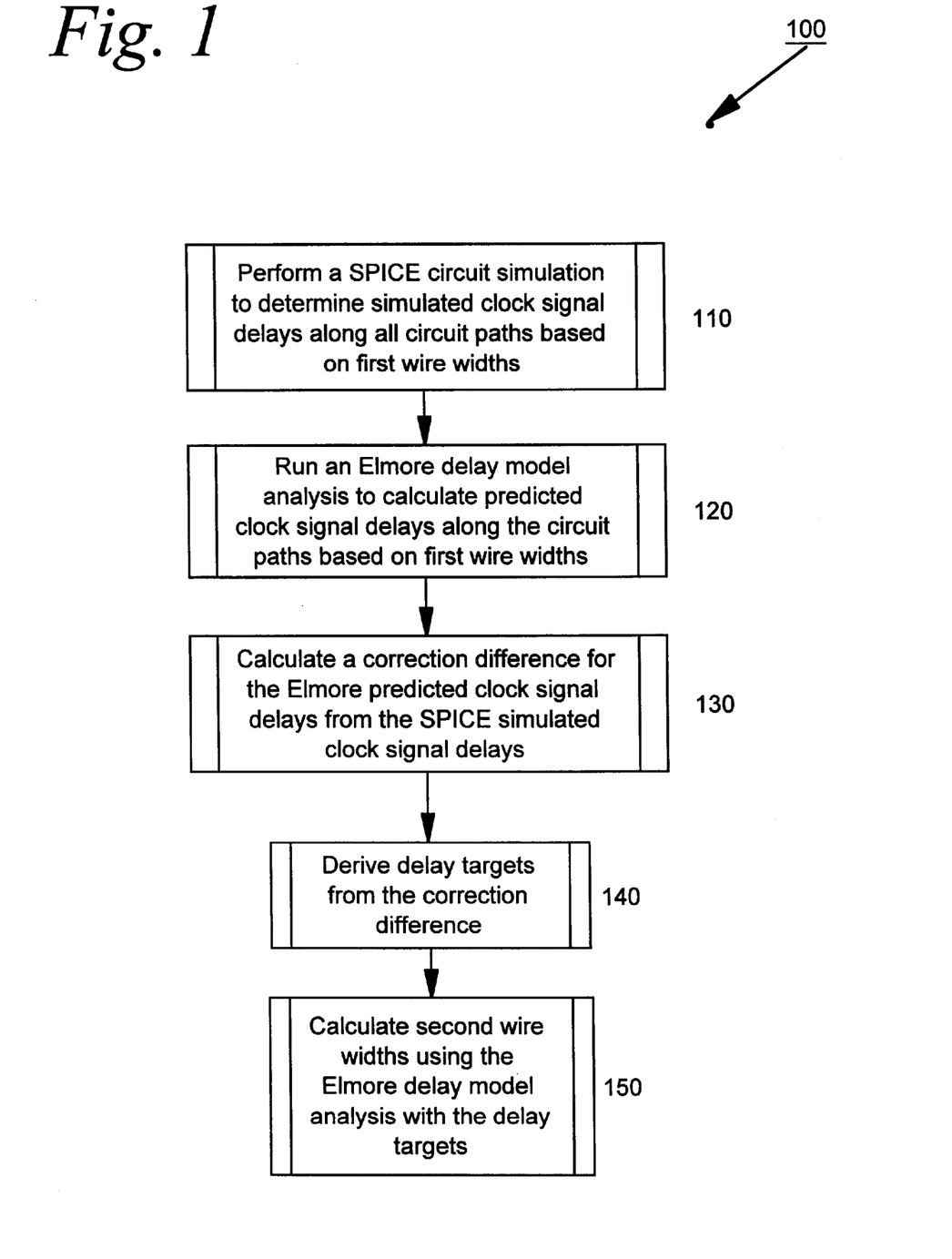
FIG. 1 is a flowchart of a method according to one embodiment.

FIG. 1 is a flowchart of a method 100 for one embodiment. The described methods utilize a SPICE simulation to ascertain the skew in clock signal delays across the many branches of a tree of wires in an electronic circuit. The described methods further use this simulated skew, in conjunction with a set of calculated delays from an Elmore resistance/capacitance model, to derive new target delays for the Elmore resistance/capacitance model and calculate adjustments to the width of wires on each branch. The method 100 begins by performing a SPICE circuit simulation to determine simulated clock signal delays along all circuit paths based upon first wire widths (step 110). The first wire widths are the starting widths of all the individual wires in the circuit prior to the operation of the method 100. These values are generally provided to the method 100 by a Computer-Aided Design (CAD) system, or by measurement of a sample circuit.

Using the same first wire widths, the step 120 runs an Elmore delay model analysis to calculate a predicted clock signal delay along each of the circuit paths being modeled. The method 100 then calculates a correction difference to be applied to the Elmore predicted clock signal delays from the SPICE simulated clock signal delays (step 130). Step 140 derives delay targets from the correction difference. The delay targets are then fed into the Elmore delay model to produce second wire widths (step 150), to which the first wire widths can be adjusted to reduce the skew in the clock signal delays.

Figure 2:
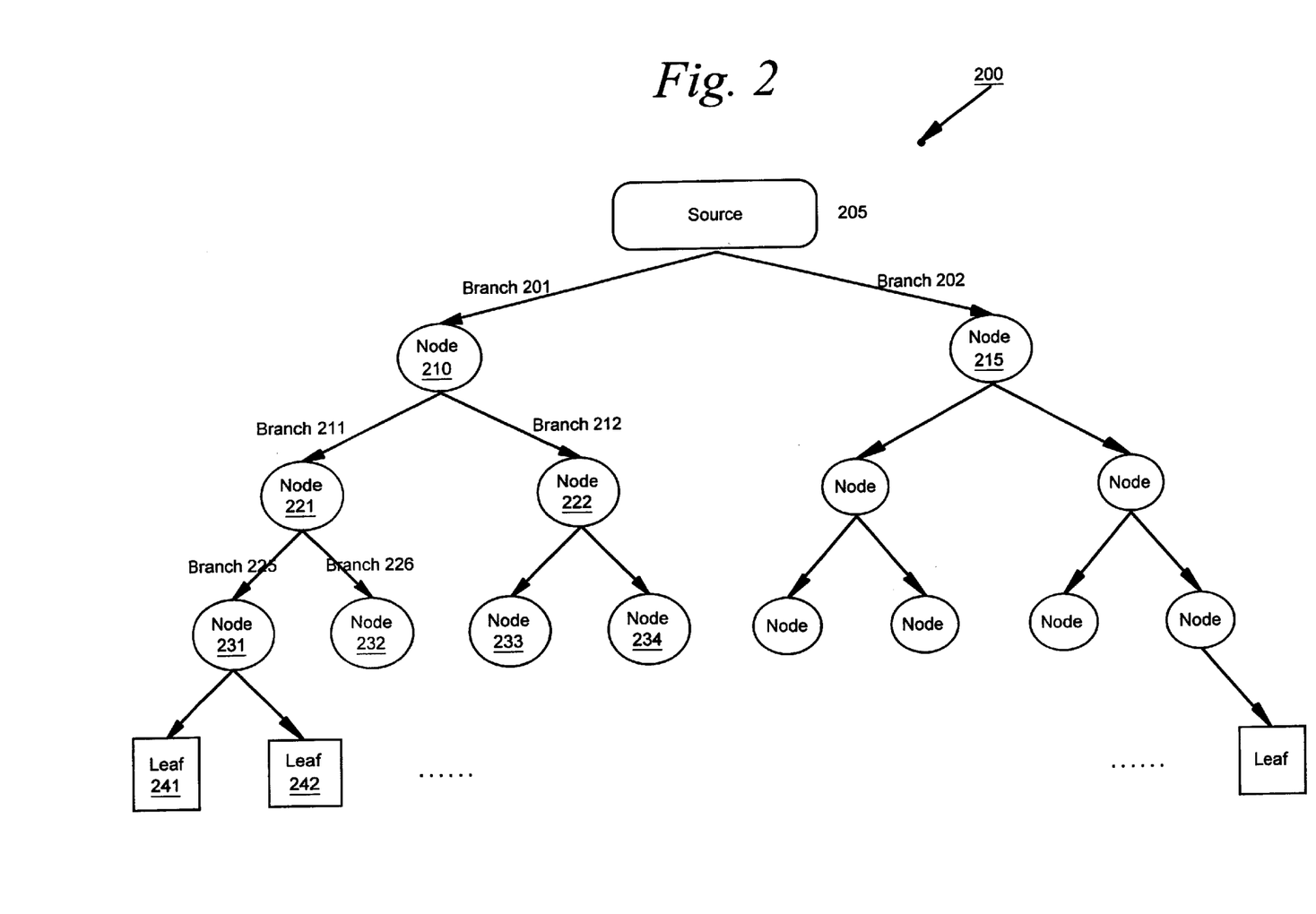
FIG. 2 is a diagram illustrating the tree structure of a sample circuit upon which the method operates.

FIG. 2 is a diagram illustrating a sample circuit tree 200 to which the methods described may be applied. The circuit tree 200 begins with a signal source 205 connected by two wire branches 201 and 202 to two nodes 210 and 215. Each of those nodes is likewise connected by wire branches to two nodes each, 221, 222, 223, and 224. This same pattern of branching into two wires and two lower nodes beneath each node continues on for several levels depending on the complexity of the circuit tree 200, with each final branch ending in a leaf, such as leaf 241 and leaf 242. The method 100 becomes most effective when executed on the circuit one node at a time, in a localized manner, rather than a global manner.

Figure 3:
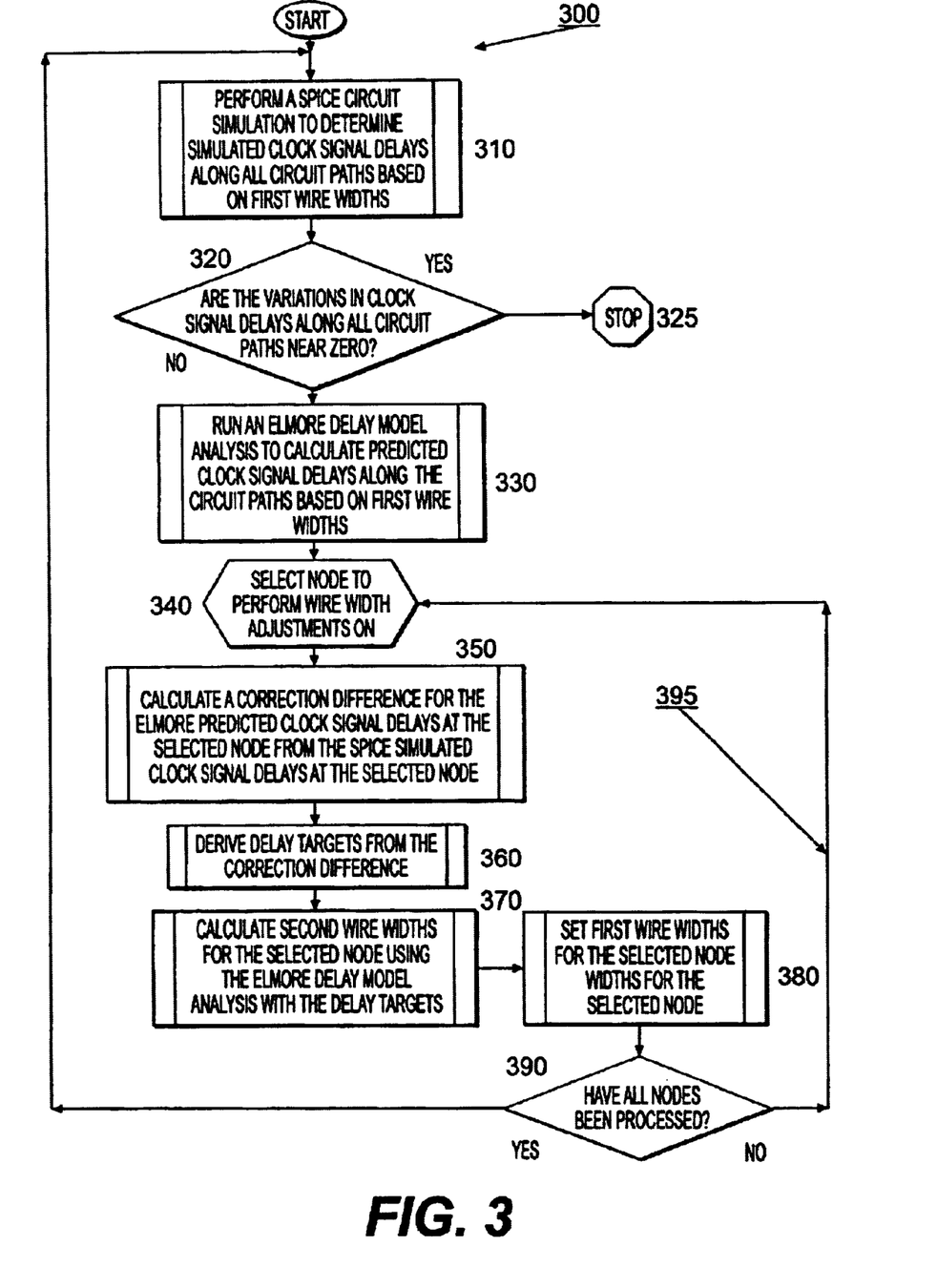
FIG. 3 is a flowchart of a method according to one embodiment.

FIG. 3 is a flowchart illustrating a method 300 according to one embodiment in which the method 100 is extended and applied iteratively to each node of the circuit tree. By proceeding one node at a time, it is possible to reach a solution optimizing the skew in clock signal delays across the entire circuit tree. Upon starting, the method 300 uses first wire widths to perform a SPICE circuit simulation to determine simulated clock signal delays along all circuit paths and for each node in the circuit tree 200 (step 310). The method 300 then tests to see if the variations, or skew, between the clock signal delays is near zero, or greater than a predetermined threshold (step 320). If the skew is near zero, then the method 300 ends (step 325). If the skew is greater than the predetermined threshold, then the method 300 runs an Elmore delay model analysis on all nodes in the circuit tree to calculate predicted clock signal delays along all circuit paths and at each node using the first wire widths (step 330).

The method 300 then proceeds to a node selection step 340 wherein the method selects a node upon which to perform wire width adjustments. The step of selecting a node 340 may be performed by an algorithm which randomly selects nodes, selects nodes generally from the lower branches and proceeds upwardly through the circuit tree, or by any other pattern or methodology. Using the simulated clock signal delays for the two branches below the selected node and for all subsequent descending branches to all the leaves below the selected node, the method 300 calculates a correction difference for the selected node (step 350). The method then derives a delay target (step 360).

The delay target is then input into the Elmore delay model to calculate new, second wire widths for the two branches off of the selected node (step 370). The first wire widths for the selected node are then replaced with the second wire widths (step 380). The method 300 then tests to see if all nodes have had second wire widths calculated (step 390). Steps 340 through 390 may be referred to as a Local Node Optimization Loop 395. If all the nodes of the circuit tree have not been processed, the method 300 then proceeds with another iteration of the Local Node Optimization Loop 395, which returns to the node selection step 340, selects another node for which to calculate wire width adjustments and proceeds through to step 390. Once all nodes have had second wire widths calculated, the method returns to step 310 to perform another SPICE circuit simulation and then to step 320 to see if the skew in the clock signal delays has been reduced to near zero. If it has, the method 300 ends (Step 325). If the skew in the clock signal delays remains greater than the predetermined near zero condition, the method 300 repeats steps 330 through 390 until it has converged on a solution wherein the skew in the clock signal delay for the circuit tree is reduced to near zero.

Figures 4A, 4B, 4C:
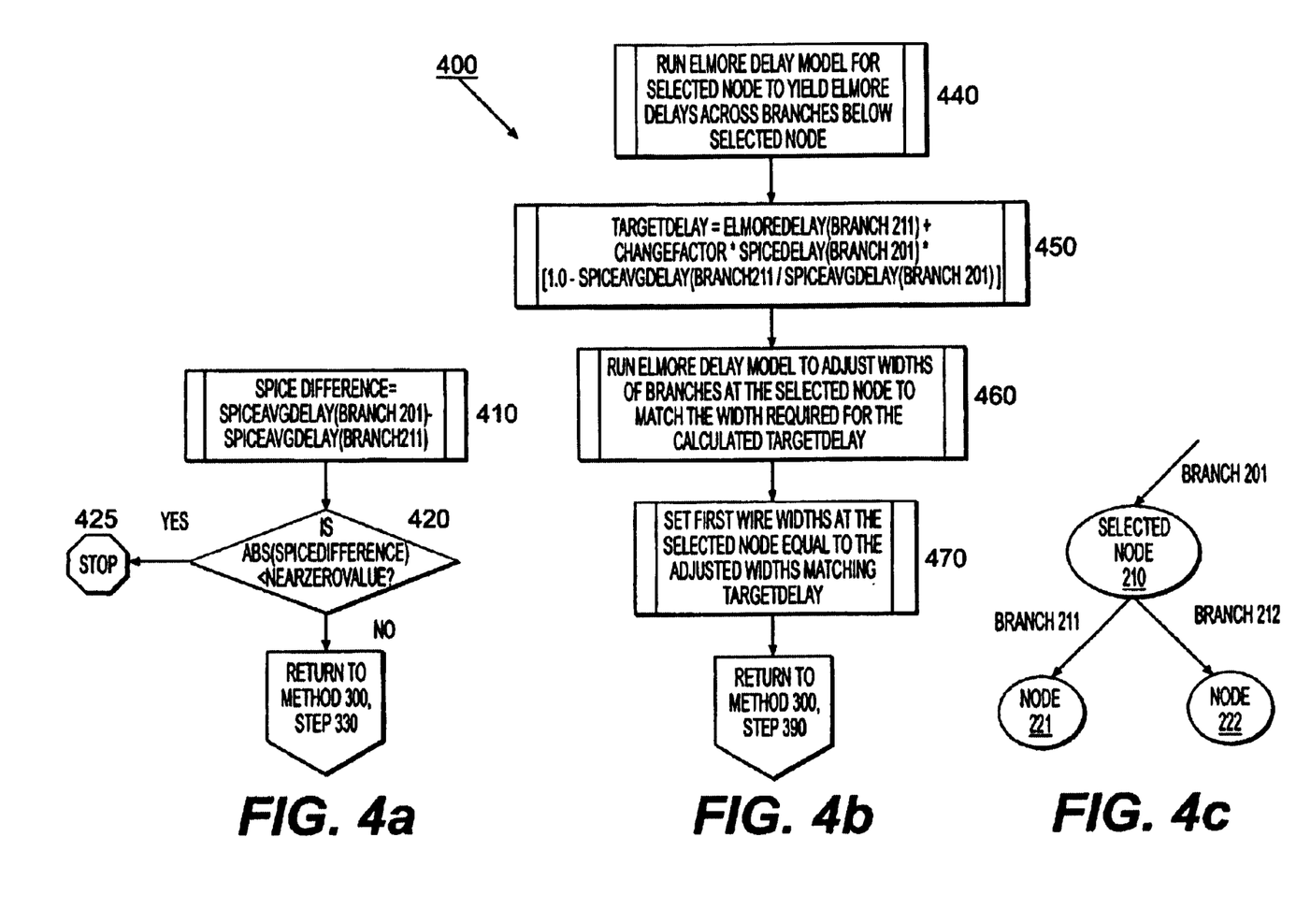
FIG. 4a is a flowchart illustrating one embodiment of the near zero condition test.
FIG. 4b is a flowchart that illustrates one embodiment of a local node optimization loop.
FIG. 4c is a diagram showing a selected node upon which the described methods operate.

FIG. 4a is a flowchart illustrating one embodiment of the near zero condition test step 320 of method 300. FIG. 4b is a flowchart that illustrates one embodiment of a method 400 that takes place inside the Local Node Optimization Loop 395. FIG. 4c is a diagram showing a selected node 210 upon which the methods of FIG. 4a and FIG. 4b operate. In FIG. 4c, the selected node 210 is shown connected to the wire branch 201 leading to it from its parent node, and to the branches 211 and 212 leading from the selected node 210 to the two child nodes below it, node 221 and node 222.

In FIG. 4a, for the calculation of the difference between the SPICE simulated delay across the two child paths from one node is performed (step 410) prior to testing the resulting SpiceDifference (step 420). Step 410 receives input data from the execution of the SPICE circuit simulation (step 310) in method 300. This data includes the average SPICE delay for each branch at each node. The average SPICE delay for branch 201 (referred to as SpiceAvgDelay(Branch 201)), leading to the selected node 210, is the average of the SPICE delays for branches 211, 212, and for all branches and nodes below nodes 221 and 222. Similarly, the average SPICE delay for branch 211 (SpiceAvgDelay(Branch 211)) is the average of the SPICE delays for all branches below node 221, and the average SPICE delay for branch 212 (SpiceAvgDelay(Branch 212)) is the average of the SPICE delays for all branches below node 222. Furthermore, SpiceAvgDelay(Branch201) is equal to (SpiceAvgDelay (Branch211)+SpiceAvgDelay(Branch212)/2. Since SpiceAvgDelay(Branch201) incorporates an average for each of the two branches below the node, SpiceAvgDelay (Branch211) and SpiceAvgDelay(Branch212), it is a total average. Therefore, subtraction of one branch's average from the total average yields an effective difference in the average clock signal delays between each branch and SpiceDifference=SpiceAverageDelay(Branch201)–SpiceAverageDelay(Branch 211) (step 410).

Step 420 compares the absolute value of SpiceDifference with a NearZeroCondition. NearZeroCondition is a predetermined value input by the user of the method which represents a skew in clock signal delays that is very near zero and is determined to be acceptable for the circuit design by the user. If the absolute value of SpiceDifference is less than the NearZeroCondition, then a solution has been reached and the method is ended (step 425). If the absolute value of SpiceDifference remains greater than NearZeroCondition, then the method returns to step 330 of method 300 described above to adjust wire widths across all circuit paths.

FIG. 4b is a flowchart that illustrates one embodiment of a method 400 implementing the Local Node Optimization Loop 395. In this embodiment, method 400 obtains Elmore delays across branches 201, 211, and 212, and for all branches and nodes below them, from the Elmore delay model (step 440). In step 450, the method 400 calculates a correction difference and applies it to the Elmore delay across branch 211 to produce a TargetDelay for branch 211. This TargetDelay equals ElmoreDelay(Branch 211)+ChangeFactor*SpiceDelay(Branch 201)*[1.0–SpiceAverageDelay(Branch 211)/SpiceAverageDelay (Branch 201)], wherein EtmoreDelay(Branch 211) is the Elmore delay across branch 211 from the Elmore delay model; ChangeFactor is a value determined and input by the user to control the adjustments to wire widths; and SpiceDelay(Branch 201) is the SPICE simulated delay across branch 201.

The method 400 then calculates second wire widths at node 210 by iteratively running the Elmore delay model until the delay at node 210 equals the TargetDelay for node 210 calculated above (step 460). Once the second wire widths are calculated, the method 400 sets the first wire widths equal to the newly calculated second wire widths (step 470), and returns to the method 300 at step 390, ready to process another node if necessary.

Figure 5:
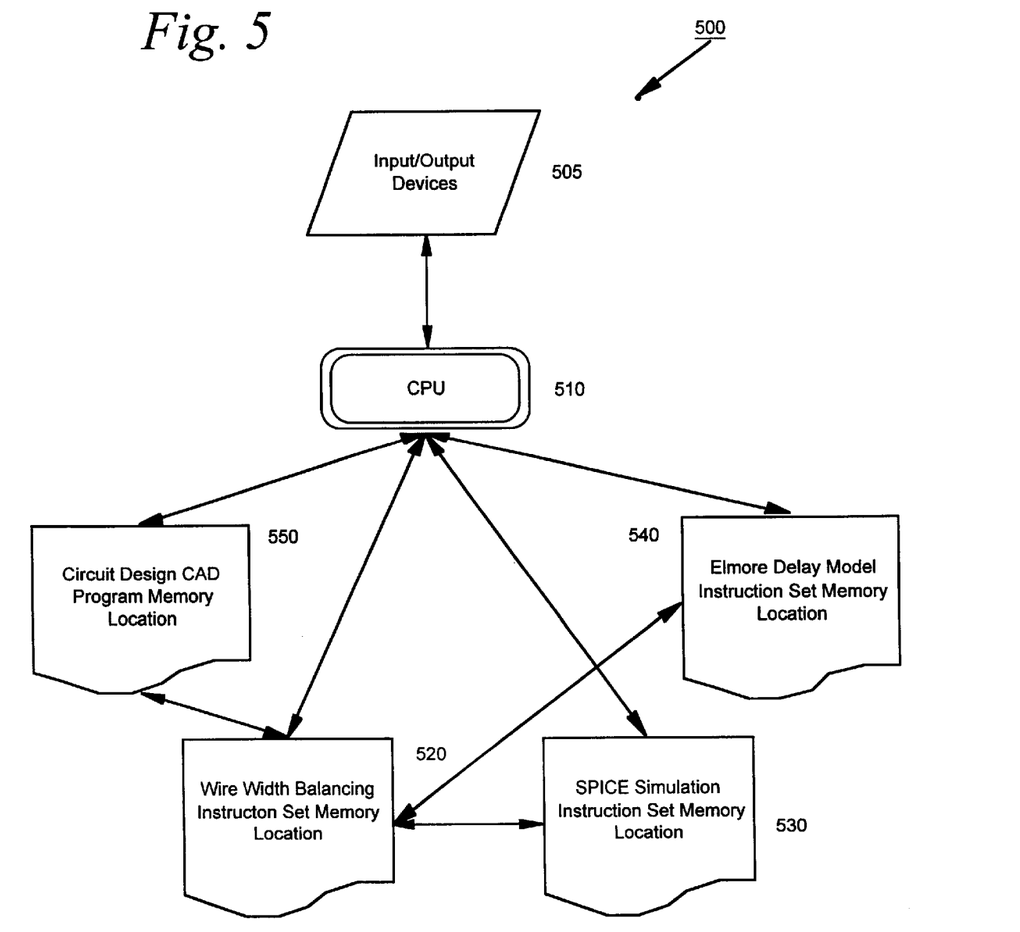
FIG. 5 is a diagram of a system according to one embodiment.

FIG. 5 is a diagram showing a system 500 for implementing the described methods. The system 500 comprises certain input and output devices 505, such as a computer keyboard, monitor, printer, or other input/output devices, operably connected to a central processing unit (CPU) 510. The CPU 510 is operably connected to certain memory locations for the wire width balancing instruction set 520 for implementing the method 300, the SPICE simulation instruction set 530, and the Elmore delay model instruction set 540. In addition, the CPU 510 may optionally be connected to a memory location for a circuit design CAD program 550 used to design the circuit tree upon which the method 300 acts through the system 500. The CPU 510 obtains first wire width data for the circuit tree from the circuit design CAD program 550 or from an input device 505. The CPU 510 then executes the software code for the wire width instruction set 520, which in turn calls upon the SPICE simulation instruction set 530 and the Elmore delay model instruction set 540 as described for the method 300.

The steps of the methods 100, 300, and 400 can be implemented with hardware or by execution of programs, modules or scripts. The programs, modules or scripts can be stored or embodied on one or more computer readable mediums in a variety of formats, such as source code, object code or executable code, for example. The computer readable mediums may include, for example, both storage devices and signals. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the described methods can be configured to access, including signals downloaded through the Internet or other networks.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method to reduce variations in signal delays along paths in a design of an integrated circuit by balancing wire widths, the method comprising:

(a') selecting a node in a tree of circuit paths;

(a) performing a circuit simulation to determine simulated signal delays along all circuit paths based on first wire widths for a given circuit, wherein the first wire widths are wire widths for branches on a level directly below the selected node;

(b) running a delay model analysis to calculate predicted signal delays along the circuit paths based on first wire widths for the given circuit;

(c) calculating a correction difference for the predicted signal delays from the simulated signal delays, comprising:
calculating a correction difference for each branch leaving a selected node by multiplying a SPICE simulated clock signal delay for a branch entering the a selected node by a user-input change factor and by the value of one minus the quotient of an average SPICE simulated clock signal delay for all branches below the branch leaving the selected node over an average SPICE simulated clock signal delay for all branches below the branch entering the selected node;

(d) deriving delay targets from the correction difference, comprising:
deriving a delay target for each branch leaving the selected node by adding the delay target for the branch leaving the selected node to the Elmore predicted clock signal delay for the branch leaving the selected node;

(e) calculating second wire widths using the delay model analysis to meet the delay targtets;

(f) setting the first wire widths equal to the second wire widths;

(g) iteratively repeating steps (a) through (f) until the variations in the signal delays alone the circuit paths reach a near zero condition;

(h) repeating steps (a) through (g) for the selected node in the tree of circuit paths;

(i) selecting another node; and (j) repeating steps (a') through (h) for the selected node in the tree of circuit paths.

2. A method to reduce variations in signal delays alone paths in a design of an integrated circuit by balancing wire widths, the method comprising:

(a') selecting a node in a tree of circuit paths;

(a) performing a circuit simulation to determine simulated signal delays along all circuit paths based on first wire widths for a given circuit, wherein the first wire widths are wire widths for branches on a level directly below the selected node;

(b) running a delay model analysis to calculate predicted signal delays along the circuit paths based on first wire widths for the given circuit;

(c) calculating a correction difference for the predicted signal delays from the simulated signal delays;

(d) deriving delay targets from the correction difference;

(e) calculating second wire widths using the delay model analysis to meet the delay targets;

(f) setting the first wire widths equal to the second wire widths;

(g) iteratively repeating steps (a) through (f) until the variations in the signal delays along the circuit paths reach a near zero condition, comprising:

calculating a SPICE simulated clock signal delay skew for the selected node by subtracting an average SPICE simulated clock signal delay for all branches below a branch leaving the selected node from an average SPICE simulated clock signal delay for all branches below the branch entering the selected node; and testing the absolute value of the SPICE simulated clock signal delay skew for the selected node against a user defined value for a near zero condition;

(h) repeating steps (a) through (g) for the selected node in the tree of circuit paths;

(i) selecting another node; and (j) repeating steps (a') through (h) for the selected node in the tree of circuit paths.

3. A computer readable medium on which is embedded a program, the program comprising components that when executed cause the computer to execute a method to reduce variations in signal delays alone paths in a design of an integrated circuit by balancing wire widths, the method comprising:

(a') selecting a node in a tree of circuit paths;

(a) performing a circuit simulation to determine simulated signal delays along all circuit paths based on first wire widths for a given circuit, wherein the first wire widths are wire widths for branches on a level directly below the selected node;

(b) running a delay model analysis to calculate predicted signal delays along the circuit paths based on first wire widths for the given circuit;

(c) calculating a correction difference for the predicted signal delays from the simulated signal delays, comprising:

calculating a correction difference for each branch leaving a selected node by multiplying a SPICE simulated clock signal delay for a branch entering the selected node by a user-input change factor and by the value of one minus the quotient of an average SPICE simulated clock signal delay for all branches below the branch leaving the selected node over an average SPICE simulated clock signal delay for all branches below the branch entering the selected node;

(d) deriving delay targets from the correction difference, comprising:

deriving a delay target for each branch leaving the selected node by adding the delay target for the branch leaving the selected node to the Elmore predicted clock signal delay for the branch leaving the selected node;

(e) calculating second wire widths using the delay model analysis to meet the delay targets;

(f) setting the first wire widths equal to the second wire widths;

(g) iteratively repeating steps (a) through (f) until the variations in the signal delays along the circuit paths reaches a near zero condition;

(h) repeating steps (a) through (g) for the selected node in the tree of circuit paths;

(i) selecting another node; and (j) repeating steps (a') through (h) for the selected node in the tree of circuit paths.

4. A computer readable medium on which is embedded a program, the program comprising components that when executed cause the computer to execute a method to reduce variations in signal delays along paths in a design of an integrated circuit by balancing wire widths, the method comprising:

(a') selecting a node in a tree of circuit paths;

(a) performing a circuit simulation to determine simulated signal delays along all circuit paths based on first wire widths for a given circuit, wherein the first wire widths are wire widths for branches on a level directly below the selected node;

(b) running a delay model analysis to calculate predicted signal delays along the circuit paths based on first wire widths for the given circuit;

(c) calculating a correction difference for the predicted signal delays from the simulated signal delays;

(d) deriving delay targets from the correction difference;

(e) calculating second wire widths using the delay model analysis to meet the delay targets;

(f) setting the first wire widths equal to the second wire widths;

(g) iteratively repeating steps (a) through (f) until the variations in the signal delays along the circuit paths reaches a near zero condition, comprising:

calculating a SPICE simulated clock signal delay skew for the selected node by subtracting an average SPICE simulated clock signal delay for all branches below a branch leaving the selected node from an average SPICE simulated clock signal delay for all branches below the branch entering the selected node; and testing the absolute value of the SPICE simulated clock signal delay skew for the selected node against a user-defined value for a near zero conditions;

(h) repeating steps (a) through (g) for the selected node in the tree of circuit paths;

(i) selecting another node; and (j) repeating, steps (a') through (h) for the selected node in the tree of circuit paths.

5. The method claim 1 wherein the signal delay is a clock signal delay.

6. The method of claim 5 wherein the delay model is an Elmore delay model.

7. The method of claim 6 wherein the circuit simulation is a SPICE circuit simulation.

8. The method of claim 7 wherein the step (e) further comprises iteratively adjusting wire widths and executing the Elmore delay model until the resulting clock signal delay from the Elmore delay model equals the delay targets.

9. The method claim 2 wherein the signal delay is a clock signal delay.

10. The method of claim 9 wherein the delay model is an Elmore delay model.

11. The method of claim 10 wherein the circuit simulation is a SPICE circuit simulation.

12. The method of claim 11 wherein the step (e) further comprises iteratively adjusting wire widths and executing the Elmore delay model until the resulting clock signal delay from the Elmore delay model equals the delay targets.

13. The computer readable medium of claim 3 wherein the signal delay is a clock signal delay, the delay model is an Elmore delay model, and the circuit simulation is a SPICE circuit simulation.

14. The computer readable medium of claim 13 wherein the step (e) in the method of calculating second wire widths further comprises iteratively adjusting wire widths and executing the Elmore delay model until the resulting clock signal delay from the Elmore delay model equals the delay targets.

15. The computer readable medium of claim 4 wherein the signal delay is a clock signal delay, the delay model is an Elmore delay model, and the circuit simulation is a SPICE circuit simulation.

16. The computer readable medium of claim 15 wherein the step (e) in the method of calculating second wire widths further comprises iteratively adjusting wire widths and executing the Elmore delay model until the resulting clock signal delay from the Elmore delay model equals the delay targets.

* * * * *

UNITED STATES PATENT AND TRADEMARK OFFICE
CERTIFICATE OF CORRECTION

PATENT NO. : 6,654,712 B1
DATED : November 25, 2003
INVENTOR(S) : Gerard M. Blair It is certified that error appears in the above-identified patent and that said Letters Patent is hereby corrected as shown below:

Column 7,
Lines 3 and 45, delete "alone" and insert therefor -- along --

Signed and Sealed this

Twelfth Day of April, 2005

JON W. DUDAS
*Director of the United States Patent and Trademark Office*